(12) United States Patent
Tanimoto et al.

(10) Patent No.: US 8,865,494 B2
(45) Date of Patent: Oct. 21, 2014

(54) MANUFACTURING METHOD FOR COMPOUND SEMICONDUCTOR LIGHT-EMITTING ELEMENT

(75) Inventors: Yoshimi Tanimoto, Osaka (JP); Takanori Sonoda, Osaka (JP); Hideaki Ikeda, Osaka (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 114 days.

(21) Appl. No.: 13/579,422

(22) PCT Filed: Feb. 18, 2011

(86) PCT No.: PCT/JP2011/053467
§ 371 (c)(1),
(2), (4) Date: Aug. 16, 2012

(87) PCT Pub. No.: WO2011/102450
PCT Pub. Date: Aug. 25, 2011

(65) Prior Publication Data
US 2012/0315718 A1  Dec. 13, 2012

(30) Foreign Application Priority Data
Feb. 19, 2010  (JP) .................. 2010-034779

(51) Int. Cl.
H01L 21/00 (2006.01)
H01L 33/42 (2010.01)

(52) U.S. Cl.
CPC ......... H01L 33/42 (2013.01); *H01L 2933/0016* (2013.01)
USPC ............................ 438/47; 438/590

(58) Field of Classification Search
CPC .................. H01L 33/42; H01L 2933/0016
USPC .......................... 438/590, 796, 47
See application file for complete search history.

(56) References Cited

U.S. PATENT DOCUMENTS

2009/0173962 A1  7/2009 Hanawa et al.
2009/0305448 A1  12/2009 Shakuda
(Continued)

FOREIGN PATENT DOCUMENTS

JP       06310452    *  6/1996  ............ H05B 33/28
JP     2005-317823      11/2005
(Continued)

OTHER PUBLICATIONS

Translation of Ito (JP08-167479A) (Jun. 25, 1996), 6 pages.*
International Search Report mailed Mar. 15, 2011, directed to International Application No. PCT/JP2011/053467; 4 pages.

*Primary Examiner* — Caridad Everhart
(74) *Attorney, Agent, or Firm* — Morrison & Foerster LLP

(57) ABSTRACT

A compound semiconductor light-emitting element characterized by high transmittance of an electrically conductive film, low contact resistance and low sheet resistance of electrically conductive film is manufactured. The manufacturing method for a compound semiconductor light-emitting element of the present invention includes the steps of: forming a semiconductor layer formed of a group III nitride semiconductor, including a light-emitting layer on a substrate; forming an electrically conductive film on the side of the semiconductor layer opposite to the side contacting the substrate; conducting first annealing on the electrically conductive film in an atmosphere containing oxygen; conducting second annealing on the electrically conductive film in an atmosphere not containing oxygen; and exposing the electrically conductive film to atmospheric air between the step of conducting first annealing and the step of conducting second annealing.

10 Claims, 6 Drawing Sheets

(56) References Cited

U.S. PATENT DOCUMENTS

| | | | |
|---|---|---|---|
| 2010/0059760 A1* | 3/2010 | Miki | 257/76 |
| 2010/0163886 A1 | 7/2010 | Fukunaga et al. | |
| 2011/0031472 A1* | 2/2011 | Tang et al. | 257/13 |
| 2011/0037052 A1* | 2/2011 | Schmidt et al. | 257/13 |
| 2012/0098023 A1* | 4/2012 | Weng et al. | 257/99 |
| 2012/0205620 A1* | 8/2012 | Sato et al. | 257/13 |

FOREIGN PATENT DOCUMENTS

| | | |
|---|---|---|
| JP | 2007-158262 | 6/2007 |
| JP | 2007-258445 | 10/2007 |
| JP | 2007-287786 | 11/2007 |
| WO | WO-2009/110539 | 9/2009 |

* cited by examiner (a)

(b)

MANUFACTURING METHOD FOR COMPOUND SEMICONDUCTOR LIGHT-EMITTING ELEMENT

REFERENCE TO RELATED APPLICATIONS

This application is a national stage application under 35 USC 371 of International Application No. PCT/JP2011/053467, filed Feb. 18, 2011, which claims the priority of Japanese Patent Application No. 2010-034779, filed Feb. 19, 2010, the entire contents of which are incorporated herein by reference.

FIELD OF THE INVENTION

The present invention relates to a manufacturing method for a compound semiconductor light-emitting element, and in particular, to a method of manufacturing compound semiconductor light-emitting element having an electrically conductive film with improved performances including light transmissivity, sheet resistance and contact resistance.

BACKGROUND OF THE INVENTION

For developing a lighting device into various lighting uses, the technique of emitting light of three primary colors of red, green and blue is indispensable. In this regard, a light emitting diode (LED) has not been developed to various uses because blue among the three primary colors is deficient due to delay in completion of blue LED.

However, after a nitride-based blue LED was invented in 1990's, products using an LED have been developed to various lighting uses including a backlight of a liquid crystal monitor, a backlight of liquid crystal television, and household use as well as a signal.

In recent years, a liquid crystal television equipped with an LED backlight rapidly come into wide use owing to price drop. Further, since lighting using an LED has a merit of better friendliness to environment over conventional lighting, owing to lower power consumption, space saving and free from mercury, it has rapidly become widespread since the summer of 2009 when lighting using an LED appeared on the market at a considerably lower price than before.

By the way, for lighting and a backlight of a liquid crystal television, white light is used. White light is generally realized by combination of a blue LED and a YAG (yttrium aluminum garnet) yellow phosphor, or by combination of a blue LED and a green phosphor and a red phosphor. In other words, a blue LED is required in any combination for realizing white light. For this reason, a method of massively manufacturing a blue LED of high brightness at a low cost is demanded.

In general, in a light-emitting layer of an LED or a laser diode (LD) of short wavelength such as blue, blue green or the like, gallium nitride (GaN), aluminum nitride (AlN), indium nitride (InN) and mixed crystals thereof are used, and further, a group III-V compound semiconductor containing nitride as a group V element is used. One example of a conventional blue LED will be described below.

FIG. 10 is a schematic sectional view showing one example of a conventional double hetero junction type blue LED. As shown in FIG. 10, the conventional double hetero junction type blue light-emitting element is formed by stacking, on a substrate 101 formed of sapphire, a lower clad layer 102 formed from a layer of n-type GaN layer doped with Si; a light-emitting layer 103 formed from an InGaN layer; an upper clad layer 104 formed of a p-type AlGaN doped with Mg; and a contact layer 105 in this order.

On contact layer 105, an electrically conductive film 108 is formed, and on a part of electrically conductive film 108, a p-type electrode 106 is provided. On the other hand, on a part on lower clad layer 102, an n-type electrode 107 is provided. When a current is injected from p-type electrode 106, the current is diffused in the planar direction of electrically conductive film 108. Then, the current injected from p-type electrode 106 is injected over a large area in upper clad layer 104 and light-emitting layer 103 to cause emission of light in light-emitting layer 103.

The light emitted upward in light-emitting layer 103 penetrates upper clad layer 104, contact layer 105, and electrically conductive film 108 and is taken outside. By using a highly light transmissive material such as ITO as electrically conductive film 108, it is possible to reduce the light loss when the light emitted in light-emitting layer 103 passes through electrically conductive film 108. Further, since electrically conductive film 108 formed of ITO has lower resistance than contact layer 105, diffusion of the operation current to the wide range for obtaining light emission is promoted, and the light-emitting area is extended, so that light-emitting efficiency can be improved.

On the other hand, electrically conductive film 108 formed of ITO exhibits a relatively high sheet resistance of greater than or equal to 20Ω/□ and less than or equal to 60Ω/□, and the sheet resistance varies depending on the site in the same. Therefore, such a problem arises that driving voltage Vf of the compound semiconductor light-emitting element becomes high, or light emission in the light-emitting layer is not uniform.

For collectively solving these problems, it is ideal to make the sheet resistance of electrically conductive film 108 less than or equal to 20Ω/□, preferably less than or equal to 10Ω/□. For reducing the sheet resistance of electrically conductive film 108, a measure of increasing the carrier density of electrically conductive film 108 by making a crystallized oxygen defective condition in electrically conductive film 108 is conceivable.

However, as the carrier density increases, the work function of electrically conductive film 108 decreases, and the potential on the side of the electrically conductive film at the interface between electrically conductive film 108 and the contact layer increases. Accordingly, a hole is difficult to be injected into the contact layer from the electrically conductive film, and as a result, the problem arises that the contact resistance between the electrically conductive film and the contact layer is high.

Also a measure of reducing the sheet resistance by conducting annealing on the electrically conductive film to increase the crystallinity of the electrically conductive film is conceivable. However, by the annealing, the binding condition at the interface between the electrically conductive film and the contact layer changes, and a stable binding condition of Ga—O, N—O, a compound of H or the like is impaired, and also in this case, the contact resistance is high.

In light of this, in Japanese Patent Laying-Open No. 2007-287786 (PTL 1), an attempt is made to reduce the sheet resistance of the electrically conductive film while keeping the contact resistance low by conducting two-step annealing including first annealing and second annealing. In the first annealing in PTL 1, the contact resistance of electrically conductive film 108 is decreased by conducting the annealing in an atmosphere containing oxygen at a temperature of greater than or equal to 250° C. and less than or equal to 600° C. In the subsequent second annealing, the sheet resistance of electrically conductive film 108 is reduced by conducting the annealing in an atmosphere not containing oxygen at a temperature of greater than or equal to 200° C. and less than or equal to 500° C.

PTL 1: Japanese Patent Laying-Open No. 2007-287786

SUMMARY OF THE INVENTION

However, when the annealing is conducted in separate two steps as described above, the contact resistance between the electrically conductive film and the contact layer tends to increase although the sheet resistance can be decreased. The increase in contact resistance leads increase in driving voltage of the compound semiconductor light-emitting element. This is contradictive to a desired purpose.

The present invention was devised in consideration of the current situation as described above, and it is an object of the present invention to provide a manufacturing method for a compound semiconductor light-emitting element realizing high transmissivity of the electrically conductive film, low contact resistance between the electrically conductive film and the contact layer, and low sheet resistance of the electrically conductive film.

A manufacturing method for a compound semiconductor light-emitting element of the present invention includes: a step of forming a semiconductor layer formed of a group III nitride semiconductor, including a light-emitting layer, on a substrate, a step of forming an electrically conductive film on the side of the semiconductor layer opposite to the side contacting the substrate, a step of conducting first annealing on the electrically conductive film in an atmosphere containing oxygen, a step of conducting second annealing on the electrically conductive film in an atmosphere not containing oxygen, and a step of exposing the electrically conductive film to atmospheric air between the step of conducting first annealing and the step of conducting second annealing.

The second annealing is preferably conducted in a nitrogen atmosphere or in a vacuum atmosphere. The first annealing is preferably conducted at a temperature of greater than or equal to 600° C. and less than or equal to 700° C. The second annealing is preferably conducted at a temperature lower than that of the first annealing.

The electrically conductive film is preferably formed of ITO, and is preferably greater than or equal to 300 nm and less than or equal to 400 nm in film thickness.

Preferably, a step of forming a first electrode that is conductive with the electrically conductive film, and a step of forming a second electrode on an exposed surface of the semiconductor layer, to be located opposite to the side where the electrically conductive film is formed, with the substrate or the light-emitting layer interposed therebetween are included.

Preferably, a step of conducting third annealing after conducting the second annealing is included. Preferably, the electrically conductive film is a contact resistance of less than or equal to 0.05Ω·cm².

In the compound semiconductor light-emitting element manufactured by the manufacturing method of the present invention, transmittance of the electrically conductive film is high, and contact resistance is low and sheet resistance of the electrically conductive film is low. Accordingly, it is possible to make the driving voltage of the compound semiconductor light-emitting element low and to increase the light extraction efficiency.

DETAILED DESCRIPTION OF THE INVENTION

Figure 1:
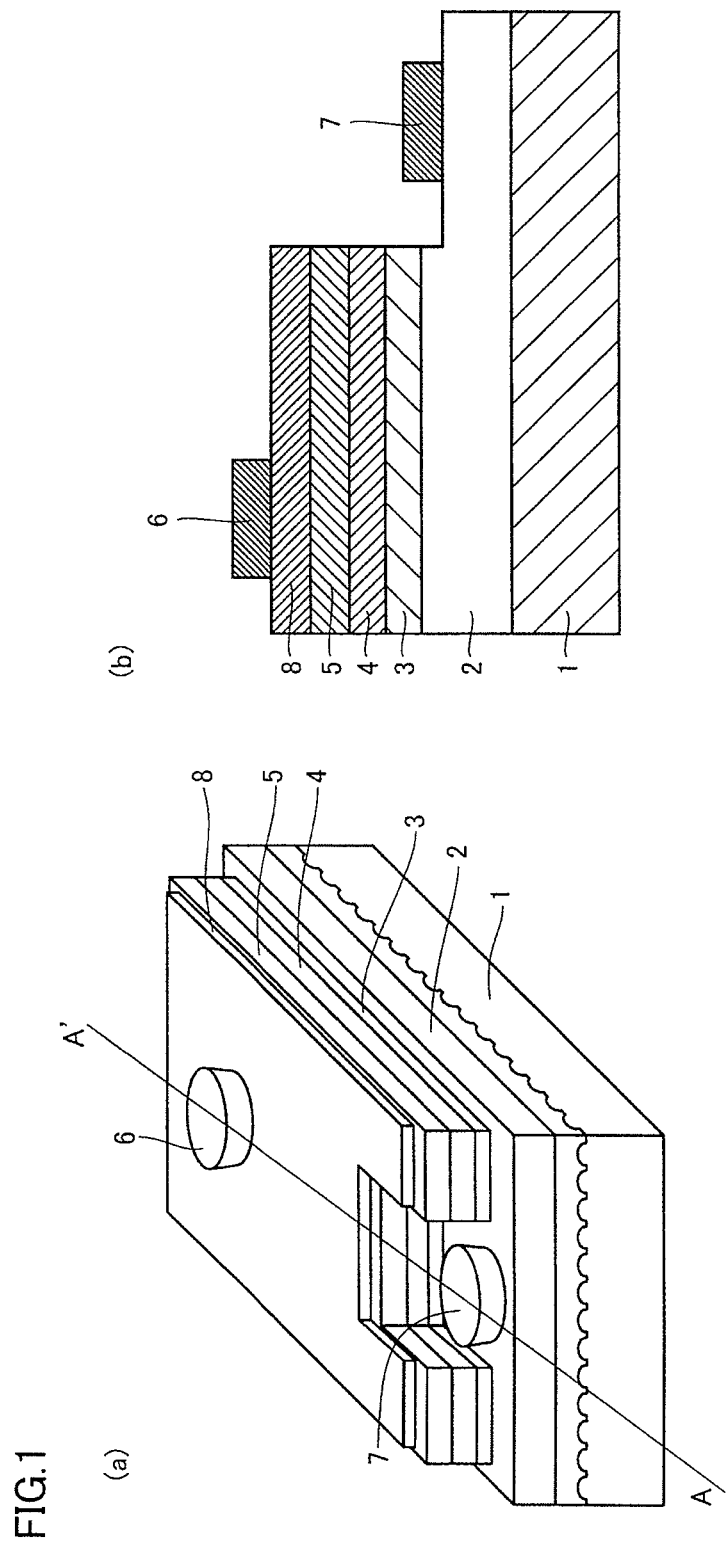
FIG. 1(*a*) is a schematic perspective view showing one example of a compound semiconductor light-emitting element manufactured by a manufacturing method of the present invention, and (b) is a sectional view of the compound semiconductor light-emitting element shown by FIG. 1(*a*) cut along the plane of A-A'.

In the following, a compound semiconductor light-emitting element manufactured by a manufacturing method of the present invention will be described. In the drawings of the present invention, the same reference numeral denotes an identical part or a corresponding part. Dimensional relationships of length, width, thickness, depth and the like are appropriately modified for clarification and simplification of drawings, and do not represent actual dimensional relationships.

<Compound Semiconductor Light-Emitting Element>

FIG. 1(*a*) is a schematic perspective view showing one example of a compound semiconductor light-emitting element manufactured by the manufacturing method of the present invention, and (b) is a sectional view of the compound semiconductor light-emitting element shown by (a) cut along the plane of A-A'. As shown in FIG. 1, the compound semiconductor light-emitting element manufactured by a manufacturing method of the present invention is formed by stacking, on a substrate 1, a lower clad layer 2, a light-emitting layer 3, an upper clad layer 4, and a contact layer 5 in this order. On contact layer 5, an electrically conductive film 8 is formed, and on electrically conductive film 8, a first electrode 6 is provided. On the other hand, on lower clad layer 2, a second electrode 7 is provided.

Here, a double hetero junction is formed by lower clad layer 2, light-emitting layer 3, and upper clad layer 4. Light-emitting layer 3 is selected from undoped one, n-type one, p-type one, and one containing impurities of both n-type and p-type, as necessary. An arbitrary interface of these semiconductor layers is a pn junction surface.

<Lower Clad Layer>

With reference to the technical significance of a double hetero structure, a clad layer means a semiconductor layer having a bandgap larger than that of the light-emitting layer and having a function of blocking an electron and a hole by a potential barrier based on the gap difference. Lower clad layer 2 defined in the present invention includes each layer having a function as a buffer layer between substrate 1 and light-emitting layer 3 and a function as a contact layer with the n-type electrode when substrate 1 is an insulating member. Such lower clad layer 2 may be a plurality of layers containing an undoped nitride semiconductor rather than only a nitride semiconductor doped with an n-type impurity. As such lower clad layer 2, for example, a low temperature buffer layer, an AlN buffer layer, an undoped layer, an n-type doping layer, an n-type contact layer and so on may be used.

In such lower clad layer 2, the layer functioning as a clad layer may be a monolayer, or a multilayer, and in the case of the monolayer, GaN, AlGaN, InAlGaN, or InGaN may be used, and Si may be contained therein, or an undoped layer may be included. When lower clad layer 2 is a multilayer, it may have a laminate structure like InGaN/GaN, InGaN/AlGaN, AlGaN/GaN, or InGaN/InGaN, or may form a multilayer structure in which a plurality of layers are repeatedly stacked. Further, these multilayer structures may form a superlattice structure.

<Light-emitting Layer>

In the present invention, light-emitting layer 3 is preferably formed by alternately stacking a barrier layer formed of GaN and a well layer formed of a nitride semiconductor containing In. Thickness of the well layer is preferably in the range of 2 to 20 nm although an optimum layer thickness differs depending on the wavelength of the light emitted by the well layer. Structure of such light-emitting layer 3 is not limited to a quantum structure, and may be any of a single well structure, a multiple well structure, a multiple quantum well structure and so on.

When light-emitting layer 3 includes a plurality of well layers, at least one well layer functions as a light-emitting layer. Such a well layer is preferably formed of $In_pGa_{1-p}N$ ($0<p<1$).

<Upper Clad Layer>

As described above, with reference to the technical significance of a double hetero structure, a clad layer means a semiconductor layer having a bandgap larger than that of the light-emitting layer and having a function of blocking an electron and a hole by a potential barrier based on the gap difference. Upper clad layer 4 defined in the present invention includes a p-type layer serving as an anti-evaporation layer, a carrier block layer, or a current diffusion layer. Each of these layers may be a monolayer or a multilayer, and may be GaN, AlGaN, InAlGaN, or InGaN doped with a p-type impurity, or may be undoped one. When upper clad layer 4 is a multilayer, it may have a laminate structure such as InGaN/GaN, InGaN/AlGaN, AlGaN/GaN or InGaN/InGaN, or a plurality of layers may be stacked repeatedly to form a multilayer structure. Moreover, such a multilayer structure may form a superlattice structure.

Thickness of upper clad layer 4 is preferably less than or equal to 500 nm. When thickness of upper clad layer 4 exceeds 500 nm, light-emitting layer 3 is exposed to heat at high temperature for a long time, and a non-light-emitting region increases due to heat deterioration of light-emitting layer 3. Above the light-emitting layer, an anti-evaporation layer is preferably formed for the purpose of preventing evaporation of In contained in the light-emitting layer.

<Contact Layer>

In the present invention, contact layer 5 is provided for reducing the contact resistance between electrically conductive film 8 and the semiconductor layer. Such contact layer 5 is preferably a nitride semiconductor doped with a p-type impurity at a higher concentration than that in upper clad layer 4. Electrically conductive film 8 may be formed on upper clad layer 4 without provision of contact layer 5. In this case, it is preferred that the concentration of the p-type impurity in the vicinity of the surface of upper clad layer 4 on the side of electrically conductive film 8 is made high.

<First Electrode and Second Electrode>

In the present invention, first electrode 6 and second electrode 7 are to become pedestals for a wire bond that electrically connects the external circuit. For first electrode 6 and second electrode 7, conventionally known structures may be employed, and for example, Ti, Al, Au and so on may be used. Also, first electrode 6 and second electrode 7 may have a multilayer structure without limited to a monolayer structure.

When first electrode 6 and second electrode 7 are formed from a multilayer structure, the uppermost layer is preferably formed with a layer formed of Au having a film thickness of about 500 nm This ensures stability of the wire bond with the external circuit when the compound semiconductor light-emitting element is mounted in a package.

By the way, part of the light emitted by light-emitting layer 3 is emitted toward the side of upper clad layer 4 of light-emitting layer 3. Therefore, first electrode 6 is an electrode arranged in the light extracting direction toward the side of upper clad layer 4 from light-emitting layer 3.

FIGS. 1(a) and 1(b) exemplarily show arrangement of second electrode 7 when substrate 1 is formed of an insulating material. In other words, when substrate 1 formed of an insulating material is used, as shown in FIGS. 1(a) and 1(b), second electrode 7 is provided on lower clad layer 2. On the other hand, when substrate 1 is formed of an electrically conductive material, second electrode 7 is formed on the surface of substrate 1 opposite to lower clad layer 2.

<Electrically Conductive Film>

In the present invention, electrically conductive film 8 is provided for transmitting the light from the light-emitting layer, contacting the semiconductor layer and expanding the light-emitting area of light-emitting layer 3 situated below electrically conductive film 8 by diffusing the current over the entire surface of the semiconductor layer contacting the same. For electrically conductive film 8, a material having lower resistance than that of contact layer 5 is preferably used. As a result, the current injected into first electrode 6 can be diffused in the planar direction of electrically conductive film 8. As a material forming such electrically conductive film 8, for example, ITO, IZO and so on are recited, and ITO is preferred. This is because ITO is particularly excellent from the view point of light transmissivity and contact resistance.

Figure 2:
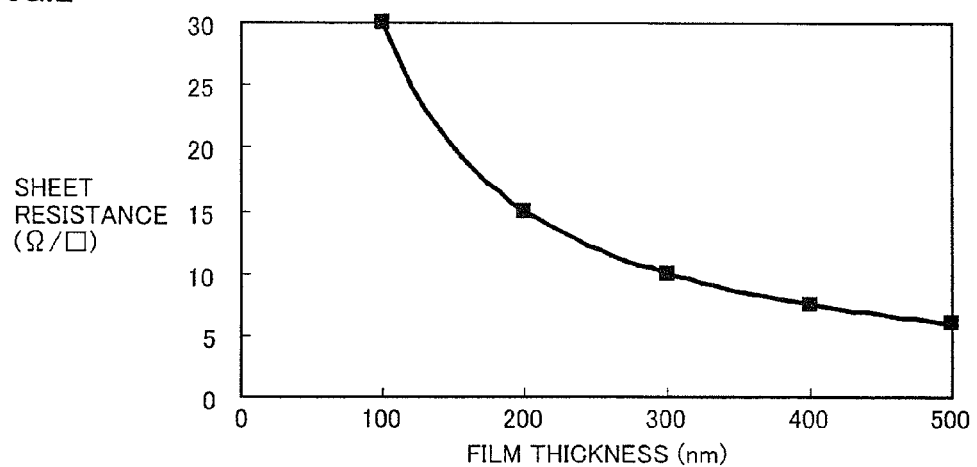
FIG. 2 is a graph showing the relation between the film thickness and the sheet resistance of the electrically conductive film.

FIG. 2 is a graph showing the relationship between the film thickness and the sheet resistance of the electrically conductive film. In FIG. 2, the vertical axis represents the sheet resistance of the electrically conductive film ($\Omega/\square$), and the horizontal axis represents the film thickness (nm) of the electrically conductive film. As shown in FIG. 2, the film thickness and the sheet resistance of electrically conductive film 8 have inverse relationship, and the smaller the film thickness of electrically conductive film 8, the higher the sheet resistance tends to be. In the present invention, as the sheet resistance, a value measured by using a four-terminal method is employed.

Since film thickness of a conventional electrically conductive film is greater than or equal to 100 nm and less than or equal to 200 nm, it was impossible to reduce the sheet resistance of the electrically conductive film to less than or equal to $10\Omega/\square$. In light of this, the present invention found that a preferred film thickness of the electrically conductive film is greater than or equal to 300 nm and less than or equal to 400 nm. By employing such a film thickness, it is possible to reduce the sheet resistance of the electrically conductive film.

Figure 3:
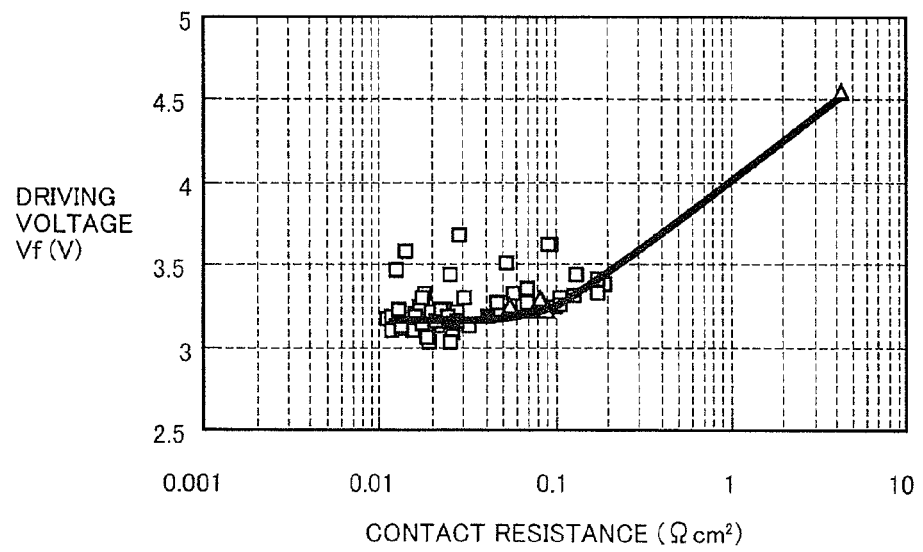
FIG. 3 is a graph showing the relation between the contact resistance of the electrically conductive film and the driving voltage of the compound semiconductor light-emitting element.

FIG. 3 is a graph showing the relation between the contact resistance of the electrically conductive film and the driving voltage of the compound semiconductor light-emitting element. As shown in FIG. 3, as the contact resistance is larger than $0.1\Omega \cdot cm^2$, the driving voltage Vf of the compound semiconductor light-emitting element increases linear-functionally.

On the other hand, when the contact resistance of the electrically conductive film is less than $0.1\Omega \cdot cm^2$, there is little difference in driving voltage Vf of the compound semiconductor light-emitting element. In particular, when the contact resistance of the electrically conductive film is less than or equal to $0.05\Omega \cdot cm^2$, for any values of the contact resistance, the driving voltages Vf of the compound semiconductor light-emitting element differ so little that they are regarded as substantially equivalent.

These results lead to the finding that the contact resistance of the electrically conductive film is preferably less than or equal to $0.05\Omega \cdot cm^2$ for reducing driving voltage Vf of the compound semiconductor light-emitting element. As the contact resistance between the electrically conductive film and the contact layer, a value measured at the interface between the electrically conductive film and the contact layer by a circular TLM (transmission line model) method is employed. In the following, a manufacturing method for a compound semiconductor light-emitting element of the present invention will be described.

<Manufacturing Method for Compound Semiconductor Light-emitting Element>

A manufacturing method for a compound semiconductor light-emitting element of the present invention is featured by including a step of forming, on substrate 1, a semiconductor layer formed of a group III nitride semiconductor, including light-emitting layer 3, a step of forming electrically conductive film 8 on the side of the semiconductor layer opposite to the contacting substrate 1, a step of conducting first annealing on electrically conductive film 8 in an atmosphere containing oxygen, a step of conducting second annealing on electrically conductive film 8 in an atmosphere not containing oxygen, and a step of exposing electrically conductive film 8 to the atmospheric air between the step of conducting first annealing and the step of conducting second annealing.

In a conventional manufacturing method, after forming an electrically conductive film, nitrogen gas and oxygen gas are introduced into a furnace, and first annealing is conducted. Then, after substituting the gas in the furnace with nitrogen gas by vacuum purging while retaining the wafer in the furnace, second annealing is conducted. Then, by regulating the temperature of the first annealing and the temperature of the second annealing, the contact resistance is reduced.

However, it was impossible to make the sheet resistance of electrically conductive film 8 less than or equal to $10\Omega/\square$. Therefore, it was impossible to make light-emitting layer 3 emit light uniformly, and the driving voltage of the compound semiconductor light-emitting element was high.

The present invention is able to solve the conventional problems as described above, and is able to reduce the sheet resistance of electrically conductive film 8 to less than or equal to $10\Omega/\square$ while keeping the contact resistance and the transmittance of electrically conductive film 8 by including, between the first annealing and the second annealing, a step of exposing electrically conductive film 8 to atmospheric air. As a result, it is possible to reduce the driving voltage of the compound semiconductor light-emitting element, and to improve the light extraction efficiency. In the following, each step of the manufacturing method of the present invention will be described.

<Step of Forming Semiconductor Layer>

In the present invention, in the step of forming a semiconductor layer, first, the temperature of substrate 1 is adjusted to, for example, 1050° C., and lower clad layer 2 is crystal-grown on substrate 1 by introducing a group III source gas, a doping gas containing Si and ammonia gas into a MOCVD apparatus using a carrier gas containing nitrogen and hydrogen.

Here, as the group III source gas introduced into the apparatus for forming lower clad layer 2, for example, TMG (($CH_3$)$_3$Ga: trimethyl gallium), TEG (($C_2H_5$)$_3$Ga: triethyl gallium), TMA (($CH_3$)$_3$Al: trimethyl aluminum), TEA (($C_2H_5$)$_3$Al: triethyl aluminum), TMI (($CH_3$)$_3$In: trimethyl indium), or TEI (($C_2H_5$)$_3$In: triethyl indium) may be used. As a doping gas containing Si, for example, $SiH_4$ (silane) gas may be used.

Next, by alternately forming a well layer containing In and a barrier layer on lower clad layer 2 by the MOCVD apparatus used in formation of lower clad layer 2, light-emitting layer 3 is formed.

After forming light-emitting layer 3, upper clad layer 4 is formed on light-emitting layer 3. For formation of upper clad layer 4, upper clad layer 4 is crystal-grown on light-emitting layer 3 by introducing a carrier gas containing nitrogen and hydrogen, a group III source gas, a doping gas containing Mg and ammonia gas into the MOCVD apparatus in the condition that substrate 1 is at a temperature suited for crystal growth of upper clad layer 4. Further, on upper clad layer 4, contact layer 5 is formed.

Here, the temperature of the substrate suited for crystal growth of upper clad layer 4 is preferably greater than or equal to 950° C. and less than or equal to 1300° C., and more preferably greater than or equal to 1000° C. and less than or equal to 1150° C. when upper clad layer 4 is formed of GaN or AlGaN. By allowing crystal growth of upper clad layer 4 at such a temperature, it is possible to realize excellent crystallinity of upper clad layer 4.

Here, as the doping gas containing Mg, for example, $Cp_2Mg$ (cyclopentadienyl magnesium) or $(EtCp)_2Mg$ (bis-ethylcyclopentadienyl magnesium) may be used. Since $(EtCp)_2Mg$ is liquid at normal temperature and normal pressure, the response when the introducing amount into the MOCVD apparatus is varied is excellent in comparison with $Cp_2Mg$ which is solid in the same condition, and the vapor pressure is more likely to be kept constant.

As the group III source gas and the ammonia gas used for formation of upper clad layer 4, gases of the kinds similar to lower clad layer 2 and light-emitting layer 3 may be used. In this manner, a semiconductor layer made up of lower clad layer 2, light-emitting layer 3, upper clad layer 4, and contact layer 5 is formed.

<Step of Forming Electrically Conductive Film>

Next, by using an electron beam vapor deposition method, or a sputtering vapor deposition method for the semiconductor layer formed in the above, an electrically conductive film 8 is formed on contact layer 5. Electrically conductive film 8 may directly be formed on upper clad layer 4. When electrically conductive film 8 is formed by a sputtering vapor deposition method, electrically conductive film 8 is formed by introducing a sputtering gas into a sputtering furnace and applying sputtering electric power.

<Step of Conducting First Annealing>

For electrically conductive film 8 formed as described above, first annealing is conducted in an atmosphere containing oxygen. By conducting the annealing in an atmosphere containing oxygen in this manner, it is possible to crystallize the material forming electrically conductive film 8, to improve transmittance of electrically conductive film 8, and to decrease the contact resistance with contact layer 5. On the other hand, since the annealing is conducted in an atmosphere containing oxygen in this manner, sufficient oxygen defect is not generated in electrically conductive film 8, and hence the sheet resistance of electrically conductive film 8 can be decreased.

Here, the first annealing is conducted preferably at a temperature of greater than or equal to 600° C. and less than or equal to 700° C. In this manner, it is possible to improve the effect of reducing the sheet resistance of electrically conductive film 8. The first annealing is conducted preferably for greater than or equal to 3 minutes and less than or equal to 30 minutes, and more preferably for less than or equal to 20 minutes.

<Step of Exposing Electrically Conductive Film to Atmospheric Air>

The greatest feature of the present invention is including a step of exposing electrically conductive film 8 to atmospheric air after the first annealing. The step of exposing to atmospheric air is achieved by bringing the electrically conductive film into contact with an ordinary room atmosphere, after lowering the temperature to less than or equal to 100° C. after end of the first annealing. By this step, the sheet resistance can be reduced to less than or equal to 10Ω/□, and hence the driving voltage of the compound semiconductor light-emitting element can be reduced to less than or equal to 3V.

Although a specific mechanism of reduction in sheet resistance of electrically conductive film 8 by the step of exposing to atmospheric air is not evidenced, it is assumable that for example, when electrically conductive film 8 is exposed to atmospheric air, the moisture existing in the atmospheric air is adsorbed on the surface of electrically conductive film 8, and the surface condition of electrically conductive film 8 is stabilized. It is assumed that by stabilizing the surface condition of electrically conductive film 8, some sort of influence (for example, promotion of deoxygenation from the composition of electrically conductive film 8, prevention of reuptake of oxygen into the composition and so on) is exerted on the composition of electrically conductive film 8 (for example, promotion of oxygen defective condition in the composition of electrically conductive film 8 and so on) in the steps subsequent to the second annealing, and the influence contributes to reduction in sheet resistance.

The step of exposing to atmospheric air is preferably conducted at a temperature ranging from greater than or equal to 0° C. to less than or equal to 100° C., and more preferably conducted in an approximate room temperature condition of about 20° C. to 30° C.

The step of exposing to atmospheric air may be conducted in the annealing furnace used in the first step, or may be conducted when taken out of the furnace. Further, the step of exposing to atmospheric air may be conducted in an artificially prepared atmosphere as long as it is conducted in an atmosphere containing moisture.

The step of exposing to atmospheric air as described above is preferably conducted for greater than or equal to 60 seconds and less than or equal to 3600 seconds. Less than 60 seconds is not preferred because it is impossible to obtain the effect of reducing the sheet resistance of electrically conductive film 8, and more than 3600 seconds is not preferred because the time required for the manufacturing step is long.

<Step of Conducting Second Annealing>

Next, a substrate is installed in a furnace, and second annealing is conducted in an atmosphere not containing oxygen. This step improves light transmissivity of the electrically conductive film and reduces the sheet resistance of the electrically conductive film. The second annealing is preferably conducted in a vacuum atmosphere, nitrogen atmosphere, argon atmosphere or mixed atmosphere of nitrogen and argon, and is preferably conducted in a nitrogen atmosphere. By forming oxygen defect in the electrically conductive film, and increasing the carrier density, by conducting the second annealing in a nitrogen atmosphere, it is possible to reduce the sheet resistance of the electrically conductive film.

Figure 4:
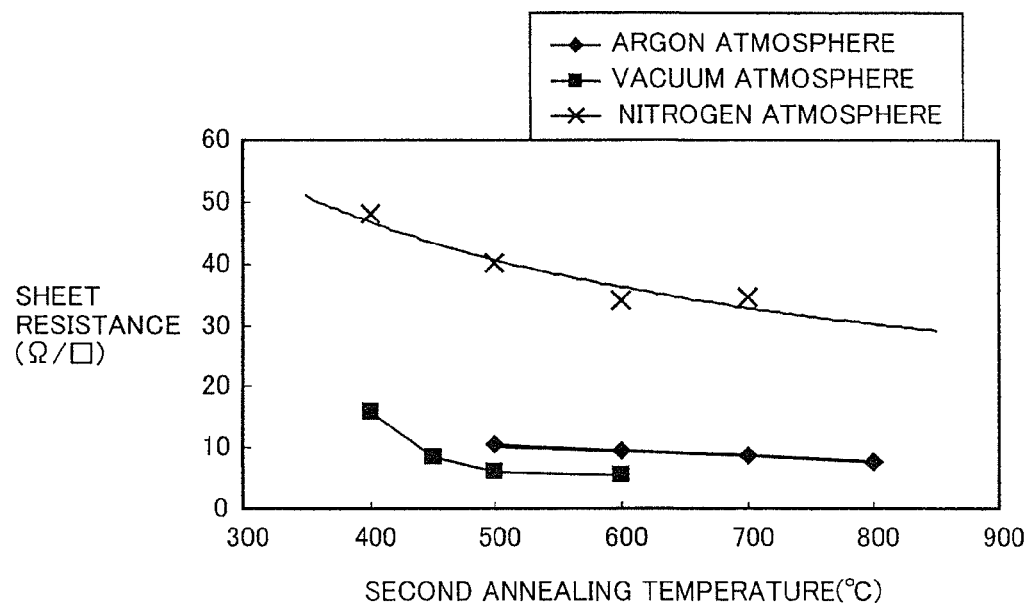
FIG. 4 is a graph showing change in sheet resistance of the electrically conductive film when the atmosphere and the temperature at the time of conducting second annealing are varied.

FIG. 4 is a graph showing change in sheet resistance of the electrically conductive film when the atmosphere and the temperature at the time of conducting the second annealing are varied. In FIG. 4, the vertical axis represents the sheet resistance (Ω/□) of the electrically conductive film, and the horizontal axis represents the temperature of the second annealing. FIG. 4 shows the sheet resistance of the electrically conductive film when the second annealing is conducted on the electrically conductive film formed of ITO having a film thickness of 320 nm in a conventional condition, in a nitrogen atmosphere, in an argon atmosphere or in a vacuum atmosphere, at a temperature of 400° C. to 800° C.

As shown in FIG. 4, from the view point of reducing the sheet resistance of the electrically conductive film, it is most preferred to conduct the second annealing in a vacuum atmosphere, and it is second most preferred to conduct the second annealing in an argon atmosphere or in a nitrogen atmosphere. Also, by conducting the second annealing at high temperature, it is possible to reduce the sheet resistance of the electrically conductive film.

Further, from the result shown in FIG. 4, it is apparent that the second annealing is preferably conducted at a temperature greater than or equal to 450° C. and less than or equal to 600° C. As a result, it is possible to further reduce the sheet resistance of the electrically conductive film. When the second annealing is conducted at a temperature of less than 500° C., the sheet resistance can be high. The second annealing is preferably conducted for greater than or equal to 1 minute and less than or equal to 10 minutes.

In the present invention, it is preferred that the second annealing is conducted at a temperature less than or equal to the annealing temperature of the first annealing. As a result, it is possible to obtain a sheet resistance of less than or equal to 10Ω/□ without impairment of the contact resistance and the transmittance.

Figure 5:
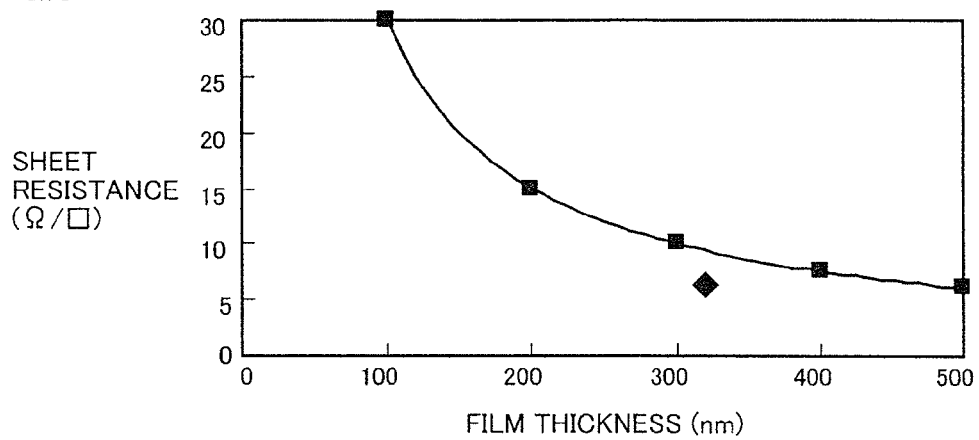
FIG. 5 is a graph adding a plot of sheet resistance of the electrically conductive film when the second annealing is conducted in a vacuum atmosphere at 500° C., to the graph of FIG. 2.

FIG. 5 is a graph adding a plot of sheet resistance of the electrically conductive film when the second annealing is conducted in a vacuum atmosphere at 500° C., to the graph of FIG. 2. As is apparent from the graph of FIG. 5, it is clear that conducting the second annealing in a vacuum atmosphere at 500° C. is effective for reducing the sheet resistance of the electrically conductive film.

Figure 6:
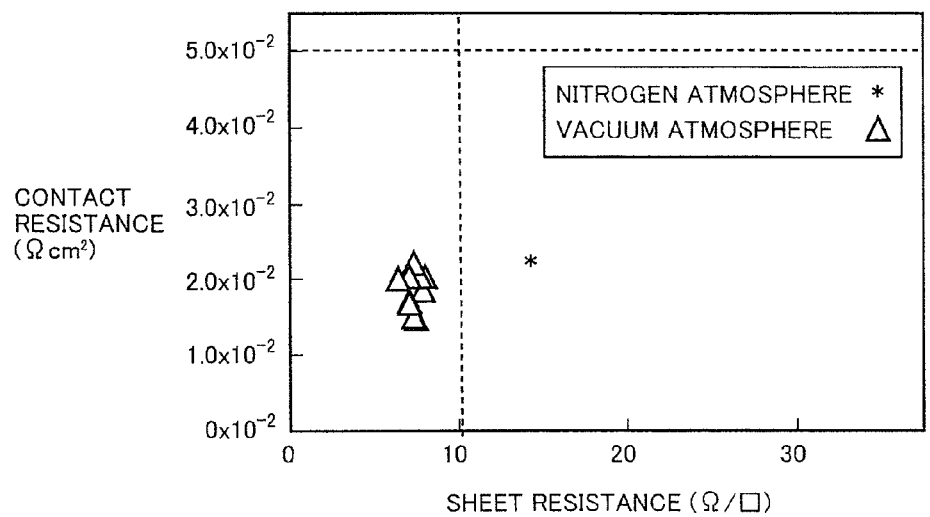
FIG. 6 is a graph plotting the contact resistance against the contact layer of the electrically conductive film, and the sheet resistance of the electrically conductive film when the second annealing is conducted in a vacuum atmosphere or in a nitrogen atmosphere.

FIG. 6 is a graph plotting the contact resistance against the contact layer of the electrically conductive film, and the sheet resistance of the electrically conductive film when the second annealing is conducted in a vacuum atmosphere or in a nitrogen atmosphere. In FIG. 6, the vertical axis represents the contact resistance (Ω·cm$^2$) of the electrically conductive film, and the horizontal axis represents the sheet resistance (Ω/□) of the electrically conductive film.

In FIG. 6, the plot in the case where the second annealing is conducted in a vacuum atmosphere is indicated by "Δ", and the plot in the case where the second annealing is conducted in a nitrogen atmosphere is indicated by "*". As shown in FIG. 6, the contact resistance can be reduced to less than or equal to $0.05\Omega\cdot cm^2$ (namely, about $2\times10^{-2}\Omega\cdot cm^2$) and the driving voltage Vf can be reduced in both cases where the second annealing is conducted in a vacuum atmosphere and where the second annealing is conducted in a nitrogen atmosphere.

Figure 7:
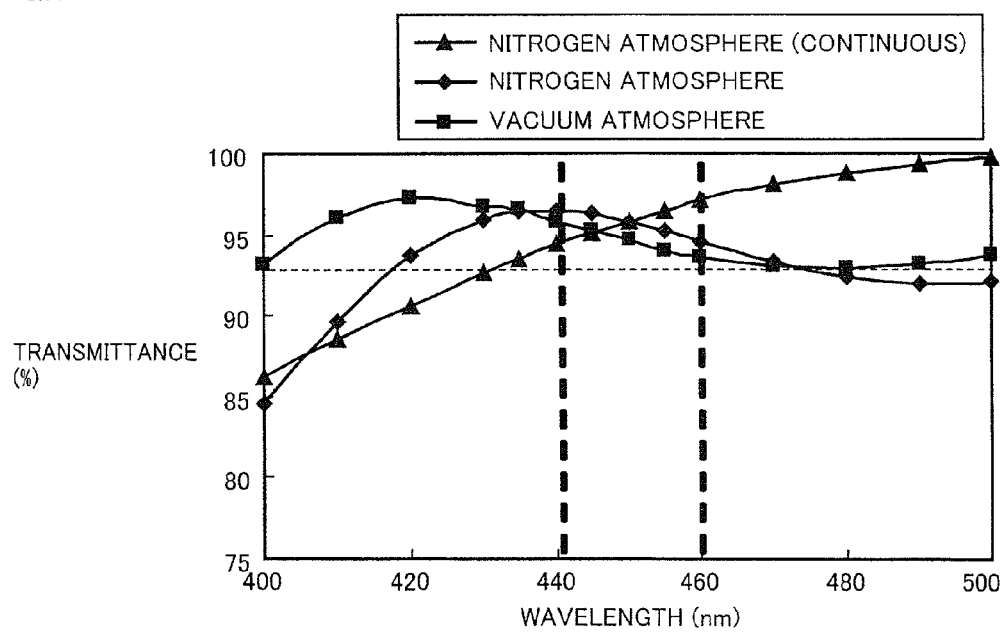
FIG. 7 is a graph showing transmittance (%) of the electrically conductive film for the light having a wavelength of greater than or equal to 400 nm and less than or equal to 500 nm when the condition of the second annealing is varied.

FIG. 7 is a graph showing transmittance (%) of the electrically conductive film for the light having a wavelength of greater than or equal to 400 nm and less than or equal to 500 nm when the condition of the second annealing is varied. In FIG. 7, the vertical axis represents the light transmittance (%) of the electrically conductive film, and the horizontal axis represents the wavelength (nm) of the incident light.

In FIG. 7, transmittance of the electrically conductive film in the case where the second annealing is conducted in a conventional film thickness condition (greater than or equal to 100 nm and less than or equal to 200 nm) in a nitrogen atmosphere is indicated by "▲", transmittance of the electrically conductive film in the case where the second annealing is conducted in a preferred film thickness condition of the present invention (greater than or equal to 300 nm and less than or equal to 400 nm) in a nitrogen atmosphere is indicated by "♦", and transmittance of the electrically conductive film in the case where the second annealing is conducted in a vacuum atmosphere is indicated by "■". In the present invention, as the transmittance of the electrically conductive film, a value measured by using a spectrophotometer is employed.

From the graph of FIG. 7, it can be found that in the compound semiconductor light-emitting elements manufactured by the present invention, the transmittance of the electrically conductive film for the light at a wavelength around 450 nm emitted from the light-emitting layer is substantially equal to the transmittance of the electrically conductive film of the compound semiconductor light-emitting element manufactured by a conventional manufacturing method, and in the wavelength range of greater than or equal to 400 nm and less than or equal to 500 nm, transmittance is stable at a certain level or higher in the order of second annealing in a vacuum atmosphere, second annealing in a nitrogen atmosphere, and the conventional condition.

<Step of Conducting Third Annealing>

In the present invention, when the step of exposing to atmospheric air is not conducted, it is particularly preferred to further conduct third annealing after conducting the second annealing. By conducting the third annealing, it is possible to increase the uniformity of the surface of the electrically conductive film. As a result, the sheet resistance is well balanced between the electrically conductive film and the contact layer, and distribution of light emission intensity in the compound semiconductor light-emitting element can be ameliorated.

Here, the third annealing is preferably conducted in an atmosphere not containing oxygen such as a nitrogen atmosphere or a vacuum atmosphere, and the third annealing is preferably conducted at a temperature of greater than or equal to 450° C. and less than or equal to 600° C. Further, the third annealing is preferably conducted for greater than or equal to 1 minute and less than or equal to 10 minutes.

FIG. 8(a) is a graph showing change in sheet resistance of the electrically conductive film after conducting each annealing, and FIG. 8(b) is a graph showing change in transmittance (%) for the light at a wavelength of 450 nm of the electrically conductive film after conducting each annealing.

Figure 8:
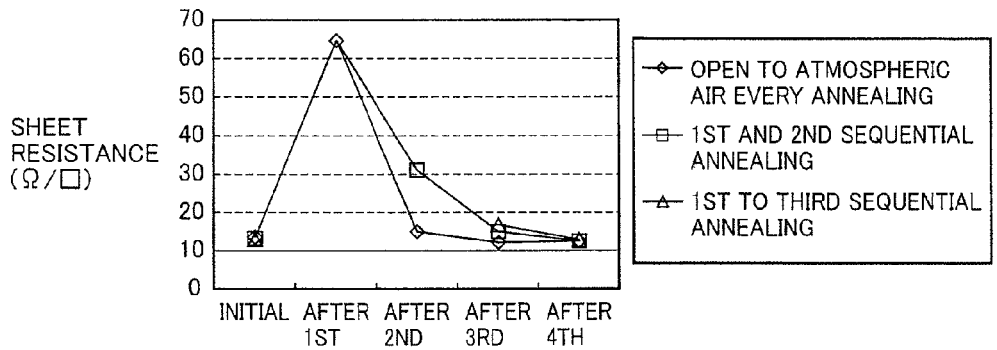
FIG. 8(*a*) is a graph showing change in sheet resistance of the electrically conductive film after conducting each annealing, and (b) is a graph showing change in transmittance (%) for the light at a wavelength of 450 nm of the electrically conductive film after conducting each annealing.
Figure 8:
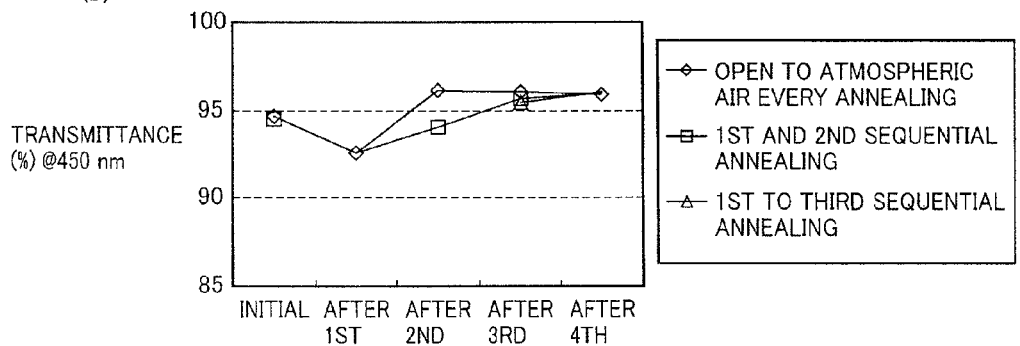

In FIG. 8 (a), change in sheet resistance ($\Omega/\square$) in three cases is examined. The three cases include the case of exposing to atmospheric air after first annealing and exposing to atmospheric air after second annealing, and conducting third annealing (◇ in the drawing), the case of once exposing to atmospheric air after sequentially conducting first annealing and second annealing, and then conducting third annealing (□ in the drawing), and the case of sequentially conducting first annealing and second annealing and third annealing without exposing to atmospheric air (Δ in the drawing).

In FIGS. 8(a) and (b), an electrically conductive film formed of ITO having a film thickness of 320 nm is used. The first annealing is conducted in a mixed atmosphere of nitrogen and oxygen at 650° C. for 10 minutes, the second annealing is conducted in a nitrogen atmosphere at 500° C. for 1 minute, and the third annealing is conducted in a nitrogen atmosphere at 500° C. for 1 minute.

First, in the sheet resistance of the electrically conductive film after second annealing in FIG. 8(a), the sheet resistance of the electrically conductive film is lower in the case of including the step of exposing to atmospheric air (◇ in the drawing) than in the case of not including the step of exposing to atmospheric air (□ in the drawing).

Likewise, in the sheet resistance of the electrically conductive film after third annealing in FIG. 8(a), the sheet resistance of the electrically conductive film is lower in the case of including the step of exposing to atmospheric air (□ in the drawing) than in the case of not including the step of exposing to atmospheric air (Δ in the drawing).

From these results, it can be found that by conducting the step of exposing to atmospheric air between individual annealings, it is possible to accelerate decrease in the sheet resistance of the electrically conductive film, and in particular by the second annealing, the sheet resistance of the electrically conductive film that is substantially equivalent to that in the case of conducting third annealing can be obtained.

Next, in FIG. 8 (b), change in transmittance (%) for the light at 450 nm in the above three cases is examined. First, in the transmittance (%) of the electrically conductive film after second annealing in FIG. 8(b), the transmittance of the electrically conductive film is higher in the case of including the step of exposing to atmospheric air (◇ in the drawing) than in the case of not including the step of exposing to atmospheric air (□ in the drawing). Likewise, in the transmittance of the electrically conductive film after third annealing in FIG. 8(b), the sheet resistance of the electrically conductive film is lower in the case of including the step of exposing to atmospheric air (□ in the drawing) than in the case of not including the step of exposing to atmospheric air (Δ in the drawing). From these results, it is apparent that by conducting the step of exposing to atmospheric air between individual annealings, it is possible to accelerate increase in transmittance of the electrically conductive film, and in particular by the second annealing, the transmittance of the electrically conductive film that is substantially equivalent to that in the case of conducting third annealing can be obtained.

<Step of Forming First Electrode and Second Electrode>

In the present invention, it is preferred to include a step of forming a first electrode that is conductive with the electrically conductive film, and a step of forming a second electrode on an exposed surface of the semiconductor layer, to be located opposite to the side where the electrically conductive film is formed, with the substrate or the light-emitting layer interposed therebetween. Formation of such a first electrode and a second electrode is preferably conducted by photolithography, electron beam vapor deposition and a lift-off method.

In the following, the present invention will be described more specifically by way of Examples, however, the present invention is not limited to these Examples.

In the present example, a compound semiconductor light-emitting element is manufactured by the following steps.

<Step of Forming a Semiconductor Layer>

A template substrate that is prepared by forming first, an MN buffer layer on a sapphire substrate having corrugated surface, and forming an undoped GaN layer and a Si-doped n-type GaN layer thereon is used. The doping concentration of the n-type GaN layer is $6\times10^{18}$ cm$^{-3}$. On this n-type GaN layer of the template substrate, an n-type GaN layer having a film thickness of 1.5 μm is grown as an n-type contact layer. As a dopant source material of the n-type GaN layer, SiR$_4$ gas is used, and Si doping concentration is $6\times10^{18}$ cm$^{-3}$. The aforementioned n-type contact layer corresponds to lower clad layer 2 shown in FIG. 1. Lower clad layer 2 is formed by crystal-growing at greater than or equal to 1000° C.

Next, the temperature is lowered to 850° C., and on lower clad layer 2, six pairs of a barrier layer formed from a Si-doped GaN layer and a well layer formed from an undoped InGaN are stacked as active layers, and a last barrier layer formed from a GaN layer having a film thickness of 6.5 nm is stacked, to form light-emitting layer 3 having a multiple quantum well structure (MQW).

Next, after raising the temperature to 1100° C., a p-type AlGaN layer is formed on light-emitting layer 3, and then a p-type GaN layer is formed. The aforementioned p-type AlGaN layer and p-type GaN layer correspond to upper clad layer 4 shown in FIG. 1. The doping concentration of upper clad layer 4 is greater than or equal to $2\times10^{19}$ cm$^{-3}$ and less than or equal to $5\times10^{19}$ cm$^{-3}$.

Next, on upper clad layer 4, contact layer 5 formed from a p+ type GaN layer having a film thickness of 20 nm is formed. The doping concentration of contact layer 5 is greater than or equal to $5\times10^{19}$ cm$^{-3}$ and less than or equal to $5\times10^{19}$ cm$^{-3}$.

<Step of Forming Electrically Conductive Film>

Then, the substrate is placed in a sputtering furnace, and argon gas is introduced as a sputtering gas while the temperature inside the furnace is kept at room temperature, and electrically conductive film 8 having a film thickness of 320 nm is formed on contact layer 5 by a sputtering power of 1.28 kWh.

<Step of Conducting First Annealing>

Next, first annealing is conducted in a mixed gas atmosphere of 2% oxygen and 98% nitrogen at 600° C. for 10 minutes. By this, transmittance for the light having a wavelength of 450 nm of electrically conductive film 8 is increased to greater than or equal to 94%.

<Step of Exposing Electrically Conductive Film to Atmospheric Air>

Then, after lowering the temperature inside the furnace to 100° C., the door of the furnace is opened to expose electrically conductive film 8 to atmospheric air.

<Step of Conducting Second Annealing>

Then the interior of the furnace is made into a vacuum atmosphere, and second annealing is conducted at 500° C. for 5 minutes. By the series of annealing steps as described above, the resistance of electrically conductive film 8 is reduced.

Thereafter, by conducting photolithography and etching, part of electrically conductive film 8 is removed. Sequentially, by conducting photolithography and etching, contact layer 5, upper clad layer 4, light-emitting layer 3, and lower clad layer 2 are partly removed, and lower clad layer 2 is exposed. By conducting ordinary photolithography, electron beam vapor deposition and a lift-off method on this exposed part, second electrode 7 is formed.

Then, by conducting ordinary photolithography, electron beam vapor deposition and a lift-off method, first electrode 6 is formed on electrically conductive film 8. Here, both of first electrode 6 and second electrode 7 have a triple-layered structure made up of Ti of 100 nm thick, Pt of 50 nm thick and Au of 500 nm thick.

A compound semiconductor light-emitting element of the present example is manufactured in a similar manner to that in Example 1 except that the step of conducting first annealing and the step of conducting second annealing in the manufacturing method for a compound semiconductor light-emitting element in Example 1 are modified.

That is, in the first annealing, annealing is conducted in a mixed atmosphere of 10% oxygen and 90% nitrogen at 650° C. for 10 minutes. Then, the electrically conductive film is exposed to atmospheric air for the same time as that in Example 1. Thereafter, the object is returned again into the furnace, and in the second annealing, annealing is conducted at 500° C. for 5 minutes after making the interior of the furnace into a nitrogen atmosphere.

The compound semiconductor light-emitting element of the present example manufactured in this manner is able to reduce the sheet resistance although the reduction is not so much as the reduction in sheet resistance of the electrically conductive film in the compound semiconductor light-emitting element manufactured in Example 1.

A compound semiconductor light-emitting element of the present example is manufactured in a similar manner to that in Example 1 except that the step of conducting second annealing is conducted in a nitrogen atmosphere rather than in a vacuum atmosphere as employed in the manufacturing method for a compound semiconductor light-emitting element in Example 1.

A compound semiconductor light-emitting element of the present example is manufactured by conducting third annealing in a nitrogen atmosphere at 500° C. for 1 minute in addition to the manufacturing method for a compound semiconductor light-emitting element in Example 1. In the compound semiconductor light-emitting element of the present example, the sheet resistance of the electrically conductive film is lower than that in Example 1, and the light extraction efficiency is improved.

<Comparison of Performance>

Figure 9:
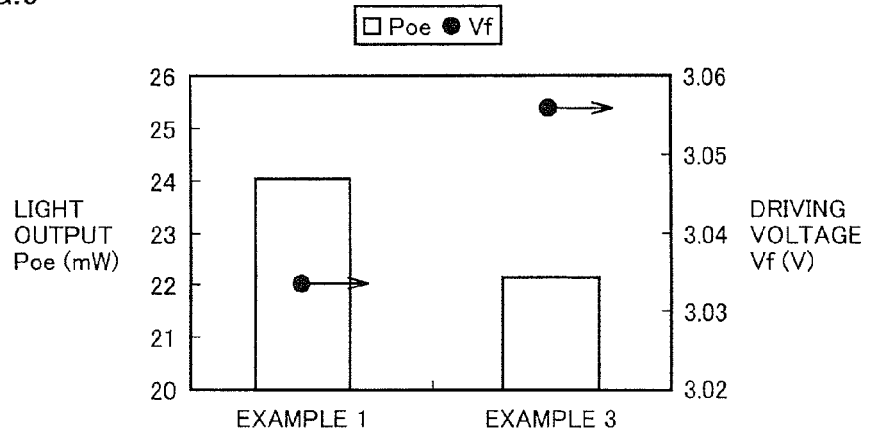
FIG. 9 is a graph showing the light output and the driving voltage of the compound semiconductor light-emitting elements in Example 1 and Example 3.
Figure 10:
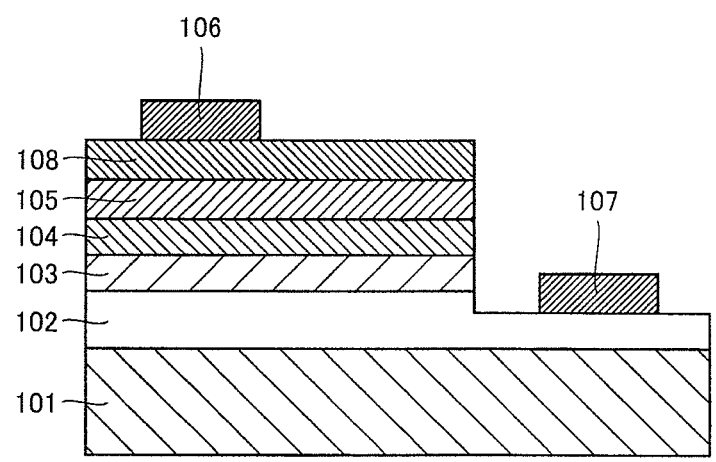
FIG. 10 is a schematic sectional view showing one example of a conventional double hetero junction type blue LED.

Performance of light output and driving voltage are compared between compound semiconductor light-emitting elements manufactured in Example 1 and Example 3. FIG. 9 is a graph showing light output and driving voltage of the compound semiconductor light-emitting elements in Example 1 and Example 3. As is apparent from the result of FIG. 9, the compound semiconductor light-emitting element in Example 1 exhibits lower driving voltage and higher light output than that in Example 3. The higher performance of the compound semiconductor light-emitting element in Example 1 is attributable to the fact that the sheet resistance of the electrically conductive film is low by conducting the second annealing in a vacuum atmosphere.

In the present invention, the compound semiconductor light-emitting element for which preferred embodiments are described above is not limited to those described above, and may have other configuration than those described above.

While description has been made for embodiments and Examples of the present invention, it is initially planned to appropriately combine configurations of individual embodiments and Examples.

It is to be understood that embodiments and Examples disclosed herein are given for exemplification rather than for limitation in all respects. The scope of the present invention is specified by claims rather than by the description as described above, and is intended to include any modification within the equivalent meaning and range of claims.

The compound semiconductor light-emitting element manufactured by a manufacturing method of the present invention is suited for use in LED lighting, backlight of liquid crystal TV and so on.

The invention claimed is:

1. A manufacturing method for a compound semiconductor light-emitting element comprising the steps of:
    forming a semiconductor layer formed of a group III nitride semiconductor, including a light-emitting layer on a substrate;
    forming an electrically conductive film on the side of said semiconductor layer opposite to the side contacting said substrate;
    conducting first annealing on said electrically conductive film in an atmosphere containing oxygen;
    conducting, after the first annealing, second annealing on said electrically conductive film in an atmosphere not containing oxygen; and
    exposing said electrically conductive film to atmospheric air between said step of conducting first annealing and said step of conducting second annealing.

2. The manufacturing method for a compound semiconductor light-emitting element according to claim 1, wherein said second annealing is conducted in a nitrogen atmosphere.

3. The manufacturing method for a compound semiconductor light-emitting element according to claim 1, wherein said second annealing is conducted in a vacuum atmosphere.

4. The manufacturing method for a compound semiconductor light-emitting element according to claim 1, wherein said first annealing is conducted at a temperature of greater than or equal to 600° C. and less than or equal to 700° C.

5. The manufacturing method for a compound semiconductor light-emitting element according to claim 1, wherein said second annealing is conducted at a temperature lower than or equal to the temperature of said first annealing.

6. The manufacturing method for a compound semiconductor light-emitting element according to claim 1, wherein said electrically conductive film is formed of ITO.

7. The manufacturing method for a compound semiconductor light-emitting element according to claim 1, wherein said electrically conductive film has a film thickness of greater than or equal to 300 nm and less than or equal to 400 nm.

8. The manufacturing method for a compound semiconductor light-emitting element according to claim 1, further comprising the steps of:
    forming a first electrode that is conductive with said electrically conductive film; and
    forming a second electrode on an exposed surface of said semiconductor layer, to be located opposite to the side where the electrically conductive film is formed, with said substrate or said light-emitting layer interposed therebetween.

9. The manufacturing method for a compound semiconductor light-emitting element according to claim 1, further comprising the step of:
    conducting third annealing after conducting said second annealing.

10. The manufacturing method for a compound semiconductor light-emitting element according to claim 1, wherein said electrically conductive film has a contact resistance of less than or equal to 0.05Ω·cm2.

* * * * *